United States Patent
Kim et al.

(10) Patent No.: US 10,304,708 B2
(45) Date of Patent: May 28, 2019

(54) TEST SYSTEM FOR MEASURING PROPAGATION DELAY TIME OF TRANSMISSION LINE

(71) Applicant: Samsung Electronics Co., Ltd., Suwon-si, Gyeonggi-do (KR)

(72) Inventors: Gyuyeol Kim, Hwaseong-si (KR); Shin-Ho Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 15/646,215

(22) Filed: Jul. 11, 2017

(65) Prior Publication Data
US 2018/0122666 A1 May 3, 2018

(30) Foreign Application Priority Data
Nov. 2, 2016 (KR) .................. 10-2016-0145377

(51) Int. Cl.
| | |
|---|---|
| *H01L 21/67* | (2006.01) |
| *G01R 1/067* | (2006.01) |
| *G01R 31/26* | (2014.01) |
| *H01L 21/683* | (2006.01) |
| *G01R 31/319* | (2006.01) |
| *G01R 31/3193* | (2006.01) |

(52) U.S. Cl.
CPC ........ *H01L 21/67253* (2013.01); *G01R 1/067* (2013.01); *G01R 31/2607* (2013.01); *G01R 31/31901* (2013.01); *G01R 31/31937* (2013.01); *H01L 21/6831* (2013.01)

(58) Field of Classification Search
CPC .......... H01L 21/67253; H01L 21/6831; G01R 31/31937; G01R 31/31901; G01R 1/067; G01R 31/2607
See application file for complete search history.

(56) References Cited

U.S. PATENT DOCUMENTS 7,206,703 B1 * 4/2007 Papageorgiou ........ G01R 31/11
702/58
7,478,287 B2 1/2009 Funaba et al.
(Continued)

FOREIGN PATENT DOCUMENTS

| JP | H9-102779 A | 4/1997 |
|---|---|---|
| JP | 2009/250803 A | 10/2009 |

(Continued)

*Primary Examiner* — Daniel R Miller
(74) *Attorney, Agent, or Firm* — Harness, Dickey & Pierce, P.L.C.

(57) ABSTRACT

A test system includes a signal generator, a plurality of transmission/reception circuits and a voltage generator. The signal generator generates a test signal. The transmission/reception circuits are connected to a plurality of transmission lines. The transmission lines each include a main line and at least one branch line connected to the main line. The transmission/reception circuits provide the test signal to the transmission lines. The transmission/reception circuits detect a response signal corresponding to the test signal. The voltage generator supplies a first reference voltage and one of the second reference voltage greater than the first reference voltage and a third reference voltage between the first reference voltage and the second reference voltage to at least one of the transmission/reception circuits.

20 Claims, 11 Drawing Sheets

(56) References Cited

U.S. PATENT DOCUMENTS

| | | |
|---|---|---|
| 8,326,565 B2 | 12/2012 | Daub et al. |
| 2006/0150019 A1 | 7/2006 | Yamazaki et al. |
| 2012/0319718 A1 | 12/2012 | Kim |

FOREIGN PATENT DOCUMENTS

| | | |
|---|---|---|
| KR | 100193323 B1 | 6/1999 |
| KR | 100702976 B1 | 4/2007 |
| KR | 2007/0097470 A | 10/2007 |
| KR | 2010/0043083 A | 4/2010 |
| KR | 2012/0137963 A | 12/2012 |

* cited by examiner

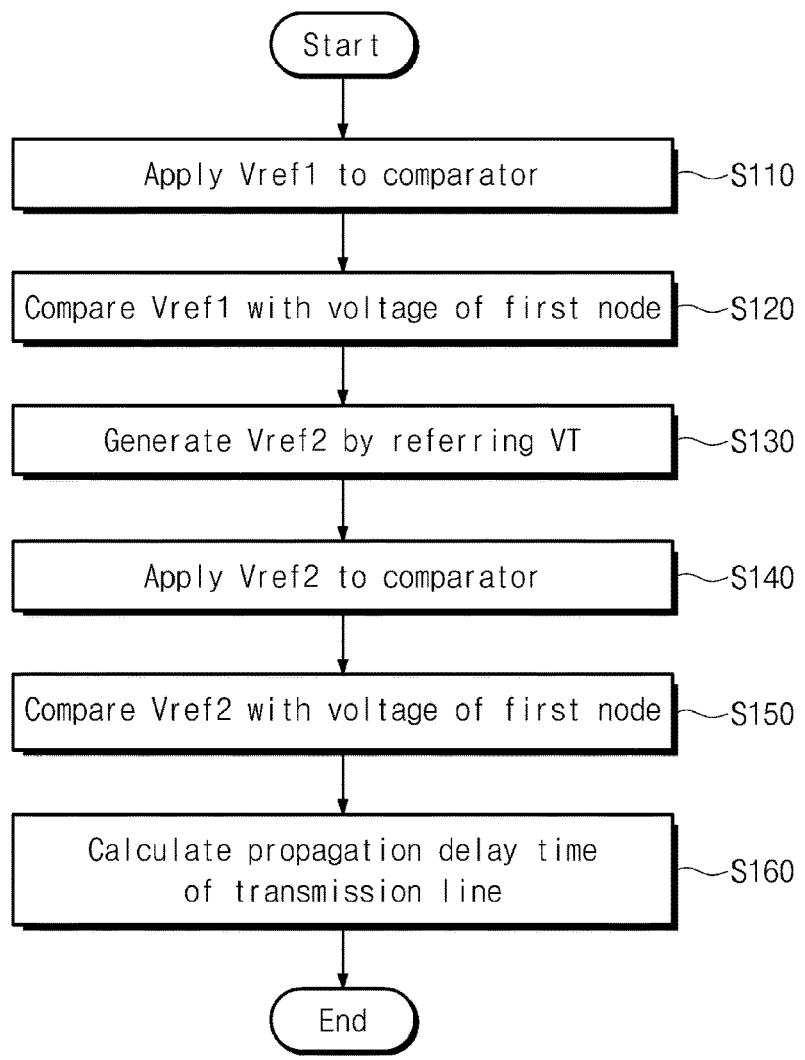

TEST SYSTEM FOR MEASURING PROPAGATION DELAY TIME OF TRANSMISSION LINE

CROSS-REFERENCE TO RELATED APPLICATION

This application claims priority under 35 U.S.C. § 119 to Korean Patent Application No. 10-2016-0145377 filed on Nov. 2, 2016 in the Korean Intellectual Property Office, the disclosure of which is hereby incorporated by reference in its entirety.

BACKGROUND

Example embodiments of the present disclosure relate to a test apparatus for testing a semiconductor device, more specifically, to a test system for measuring a propagation delay time of a transmission line connected to a semiconductor device and a method for measuring a propagation delay time thereof.

A semiconductor test apparatus tests electrical characteristics of semiconductor devices on a wafer. The semiconductor devices may include volatile or nonvolatile memory, and/or application specific integrated circuits, and/or other components of electronic systems. The semiconductor test apparatus tests the semiconductor devices through a probe card and/or a test socket. The semiconductor test apparatus may include transmission lines for transmitting signals.

Before testing the semiconductor devices, the semiconductor test apparatus may measure a propagation delay time of each of, or at least one of, the transmission lines. The semiconductor test apparatus may adjust an output timing of a test signal based on the propagation delay time of each of the transmission lines. As the number of the semiconductor devices in the wafer increases, the number of the transmission lines increases as well. The semiconductor test apparatus measures a propagation delay time of each of, or at least one of, the transmission lines.

SUMMARY

According to example embodiments of the inventive concepts, a test system may include a signal generator configured to generate a test signal, a first transmission line and a first branch line connected to the first transmission line, a first transmission/reception circuit connected to the first transmission line, wherein the first transmission/reception circuit is configured to provide the test signal to the first transmission line and the first branch line and to detect a first response signal corresponding to the test signal from the first transmission line and the first branch line, a second transmission line and a second branch line connected to the second transmission line, wherein the second branch line includes more number of branch lines than the first branch line, a second transmission/reception circuit connected to the second transmission line, wherein the second transmission/reception circuit is configured to provide the test signal to the second transmission line and the second branch and to detect a second response signal corresponding to the test signal from the second transmission line and the second branch line, and a voltage generator configured to apply a first reference voltage and a second reference voltage greater than the first reference voltage to the first transmission/reception circuit and to apply the a first reference voltage and a third reference voltage greater than the first reference voltage and smaller than the second reference voltage to the second transmission/reception circuit.

According to example embodiments of the inventive concepts, a test system may include a signal generator configured to generate a test signal, a plurality of transmission lines each including a main line and at least one branch line connected to the main line, a plurality of transmission/reception circuits configured to provide the test signal to the transmission lines, wherein the transmission/reception circuits is configured to detect a response signal corresponding to the test signal from each of, or at least one of, the transmission lines, and a voltage generator configured to apply a first reference voltage and one of a second reference voltage greater than the first reference voltage and a third reference voltage between the first reference voltage and the second reference voltage to at least one of the transmission/reception circuits.

According to example embodiments of the inventive concepts, a semiconductor test system may include a tester component configured to supply a first reference voltage, a second reference voltage, and a third reference voltage to at least two transmission/reception circuits, the second reference voltage being greater than the first reference voltage and the third reference voltage being greater than the first reference voltage and less than the second reference voltage. The tester component may include a processor configured to execute machine readable instructions to calculate a first propagation delay time and a second propagation delay time of at least two transmission lines connected to corresponding ones of the at least two transmission/reception circuits. The tester component may be configured to measure a first time corresponding to a time a first node of the tester head is at the first reference voltage, measure a second time corresponding to a time the first node of the tester head is at the second reference voltage, measure a third time corresponding to a time a second node of the test head is at the first reference voltage, and measure a fourth time corresponding to a time the second node of the tester head is at the third reference voltage. The tester component may be configured to test a device under test by adjusting first and second output clock signals by an amount corresponding to the first and second propagation delay times.

BRIEF DESCRIPTION OF THE DRAWINGS

FIG. 7 illustrates a table for reference when generating a reference voltage from a voltage generator according to example embodiments of the inventive concepts.

FIG. 8 is a flow chart illustrating a method of operating the test apparatus according to example embodiments of the inventive concepts.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
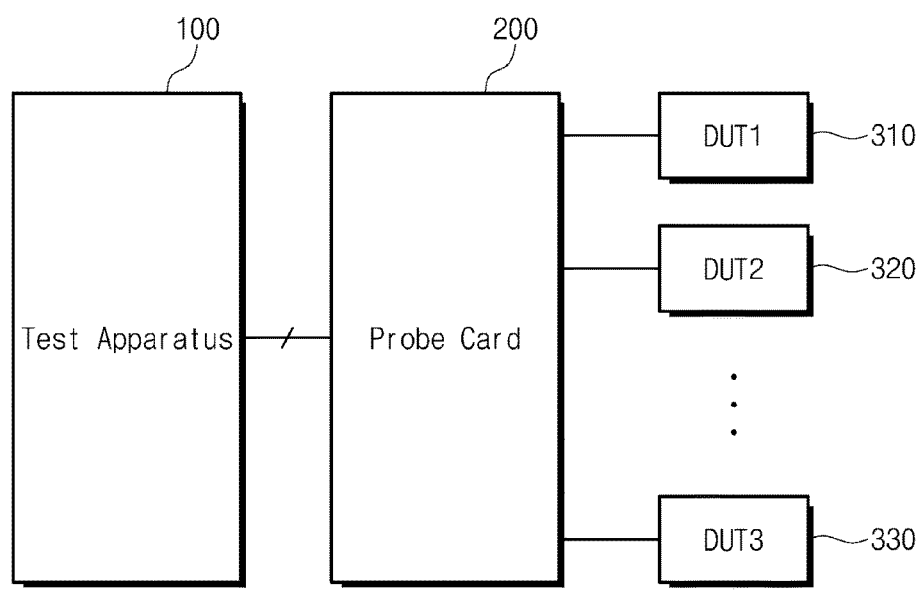
FIG. 1 is a block diagram illustrating a test apparatus, a probe card connected to the test apparatus and devices under test according to example embodiments of the inventive concepts.

FIG. 1 is a block diagram illustrating a test apparatus, a probe card connected to the test apparatus and devices under test according to example embodiments.

Referring to FIG. 1, a test apparatus 100 may be connected to a probe card 200 through a plurality of transmission lines. The test apparatus 100 may be an automatic test device (ATE) for testing a plurality of devices under test (DUTs), for example, first through third DUTs 310, 320 and 330. The test apparatus 100 may apply a signal and power to the probe card 200 for testing the DUTs 310, 320 and 330.

The probe card 200 may connect the test apparatus 100 to the first through third DUTs 310, 320 and 330. The probe card 200 may be connected to the test apparatus 100 through the transmission lines. The probe card 200 may include at least one branch line connected to each of, or at least one of, the transmission lines. The transmission lines may be main lines. The probe card 200 may be connected to the first through third DUTs 310, 320 and 330 through the branch line. The probe card 200 may transmit the signal and power to the first through third DUTs 310, 320 and 330 through the branch line.

Each of, or at least a plurality of, the first through third DUTs 310, 320 and 330 may be connected to the probe card 200 through the branch line. The first through third DUTs 310, 320 and 330 may be semiconductor devices. For example, the first through third DUTs 310, 320 and 330 may include any one of a volatile memory device including Dynamic Random Access Memory (DRAM) or a nonvolatile memory device including NAND and/or NOR FLASH memory.

When the power supply is interrupted, data stored in the volatile memory device may disappear. The volatile memory device may include, for example, a static random access memory (SRAM), a dynamic random access memory (DRAM) or a synchronous DRAM. Even when the power supply is interrupted, data stored in the nonvolatile memory device may be kept. The nonvolatile memory device may include, for example, a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM) or a ferroelectric RAM (FRAM).

The probe card 200 may be connected to the first through third DUTs 310, 320 and 330. In some embodiments, the probe card 200 may be connected to at least one DUT.

Before testing the first through third DUTs 310, 320 and 330, the test apparatus 100 may estimate a length of each of, or at least a plurality of, the transmission lines connecting the test apparatus 100 to the first through third DUTs 310, 320 and 330. The test apparatus 100 may measure a propagation delay time of each of or at least a plurality of, the transmission lines to estimate the length of each of, or at least a plurality of, the transmission lines. A method of estimating the length of each of, or at least a plurality of, the transmission lines by the test apparatus 100 are described in detail with reference to FIGS. 2 through 11.

Figure 2:
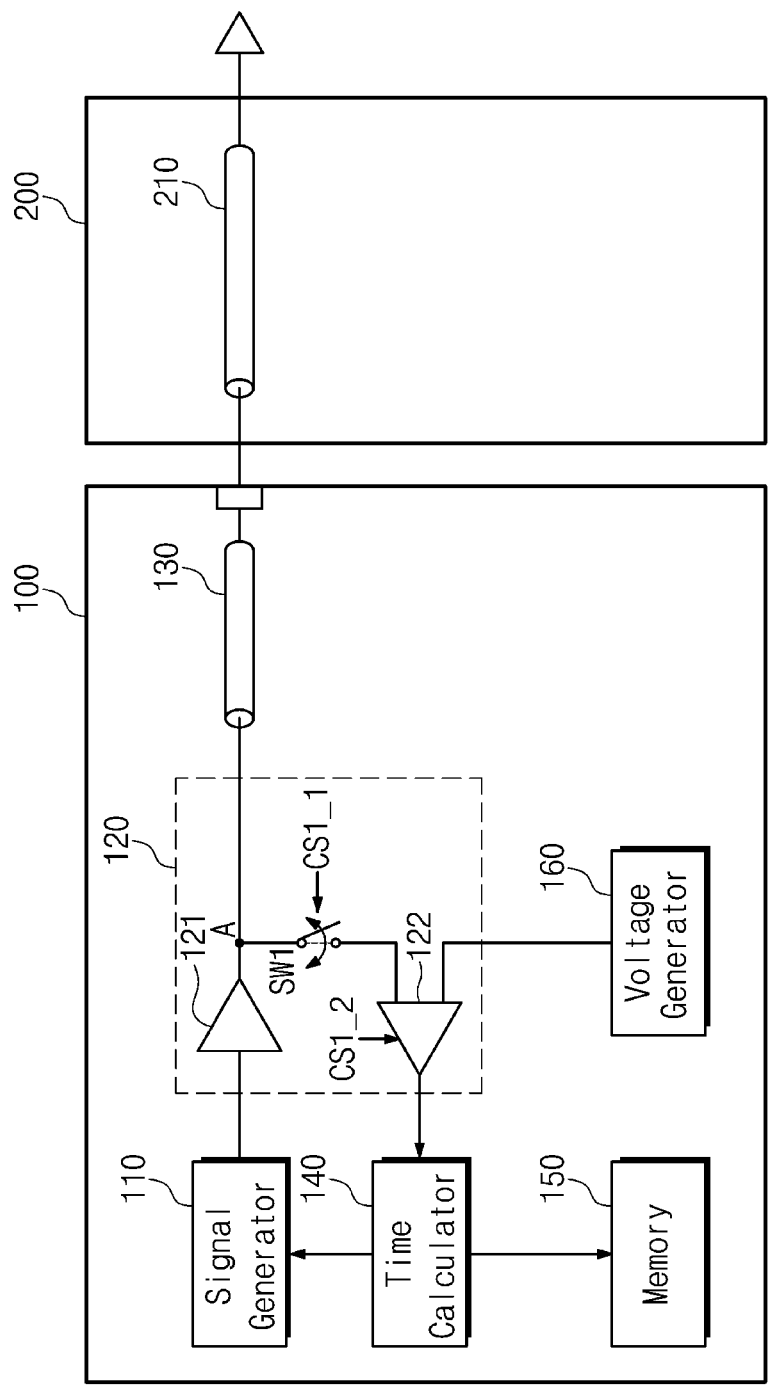
FIG. 2 is a block diagram illustrating the test apparatus and the probe card according to example embodiments of the inventive concepts.

FIG. 2 is a block diagram illustrating the test apparatus and the probe card as shown of FIG. 1 according to example embodiments.

Referring to FIG. 2, the test apparatus 100 may include a signal generator 110, a transmission/reception circuit 120, a first transmission line 130, a time calculator 140, a memory 150, and a voltage generator 160. The probe card 200 may include a first branch line 210 connected to the first transmission line 130. The first branch line 210 may have one end connected to the first transmission line 130 and the other end that is an open end. The first branch line 210 may include one branch line as shown in FIG. 2, but the inventive concepts are not limited thereto. For example, the first branch line 210 may include a plurality of branch lines. In an example embodiment, the probe card 200 may include the plurality of branch lines connected to the first transmission line 130.

The signal generator 110 may generate various test signals. For example, the signal generator 110 may generate a test signal for measuring a length of the first transmission line 130 and the first branch line 210. The signal generator 110 may transmit the test signal to an amplifier 121.

The transmission/reception circuit 120 may include the amplifier 121, a first switch SW1 and a comparator 122. The amplifier 121 may be connected between the signal generator 110 and a first node A. The amplifier 121 may receive the test signal from the signal generator 110 to amplify the test signal. The amplifier 121 may transmit the amplified test signal to the first transmission line 130. The test signal (e.g., the amplified test signal) may be transmitted to the first branch line 210 through the first transmission line 130. The test signal may be reflected at the first branch line 210.

The first switch SW1 may be connected between the comparator 122 and the first node A. The first switch SW1 may be connected or disconnected by a first switch control signal CS1_1. As an example, when a propagation delay time (TPD) of the first transmission line 130 and the first branch line 210 is measured, the first switch SW1 may be connected. When the propagation delay time (TPD) of the first transmission line 130 and the first branch line 210 is measured, the first switch SW1 may be disconnected.

The comparator 122 may detect a voltage generated from the first node A by the test signal. The voltage of the first node A sensed by the comparator 122 is described in detail with reference to FIG. 3.

Figure 3:
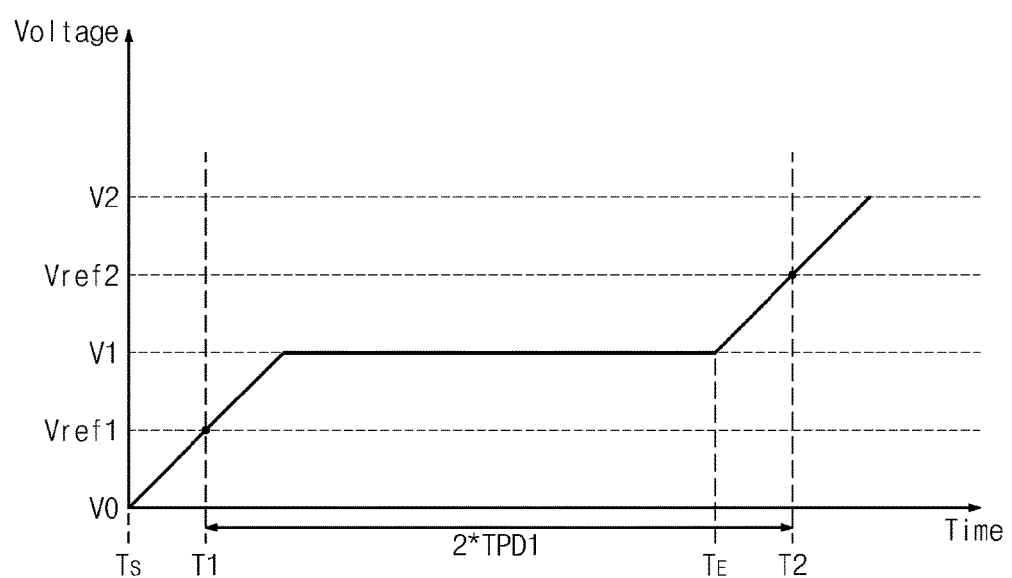
FIG. 3 is a graph illustrating voltages generated from a first transmission line and a first branch line, which are detected by a comparator according to example embodiments of the inventive concepts.

FIG. 3 is a graph illustrating voltages generated from the first transmission line 130 and the first branch line 210, which are detected by the comparator 122 of FIG. 2 according to example embodiments.

Referring to FIG. 3, a horizontal axis may represent time and a vertical axis may represent voltage. When a test signal is applied from the amplifier 121 to the first node A, a magnitude of the voltage of the first node A may gradually increase from '0'. The voltage of the first node A may increase to a first voltage V1. The test signal may be reflected from the open end of the first branch line 210. The voltage of the first node A may be maintained at the first voltage V1 until the reflected test signal reaches at the first node A. When the reflected test signal reaches the first node A, the voltage of the first node A may rise. The voltage of the first node A may rise to a second voltage V2.

Referring to FIGS. 2 and 3, the comparator 122 may operate based on the first comparator control signal CS1_2. The first comparator control signal CS1_2 may activate the comparator 122. When the first comparator control signal CS1_2 is received by the comparator 122, the comparator 122 may compare a first reference voltage Vref1 or a second reference voltage Vref2 with the voltage of the first node A.

The voltage generator 160 may apply the first reference voltage Vref1 or the second voltage Vref2 to the comparator 122. The first reference voltage Vref1 may be between '0' and the first voltage V1. As an example, the first reference voltage Vref1 may be an intermediate value between '0' and the first voltage V1.

The comparator 122 may measure a time when the voltage of the first node A reaches the first reference voltage Vref1, based on the first comparator control signal CS1_2. At this time, the voltage of the first node A reaches the first reference voltage Vref1 at a first time T1. When the voltage of the first node A is lower than the first reference voltage Vref1, the comparator 122 may output a fail signal to the time calculator 140. When a magnitude of the voltage of the first node A is equal to or higher than a magnitude of the first reference voltage Vref1, the comparator 122 may output a pass signal to the time calculator 140. As an example, the fail signal may be a low signal, and the pass signal may be a high signal. The fail signal and the pass signal may each be a digital signal.

The second reference voltage Vref2 may be between the first voltage V1 and the second voltage V2. As an example, the second reference voltage Vref2 may be an intermediate voltage between the first voltage V1 and the second voltage V2. The comparator 122 may measure a time when the voltage of the first node A reaches the second reference voltage Vref2, based on the first comparator control signal CS1_2. At this time, a second time T2 may be a time point when the voltage of the first node A reaches the second reference voltage Vref2. When the voltage of the first node A is lower than the second reference voltage Vref2, the comparator 122 may output the fail signal to the time calculator 140. When a magnitude of the voltage of the first node A is equal to or greater than a magnitude of the second reference voltage Vref2, the comparator 122 may output the pass signal to the time calculator 140.

In an example embodiment, the first switch control signal CS1_1 and the first comparator control signal CS1_2 may be generated from the voltage generator 160. However, the inventive concepts are not limited thereto. In some embodiments, the first switch control signal CS1_1 and the first comparator control signal CS1_2 may be generated outside the test apparatus 100.

As described above, the comparator 122 may compare each of the first and second reference voltages Vref1 and Vref2 with the voltage of the first node A and may transmit a comparison result as the digital signal to the time calculator 140.

The time calculator 140 may receive the digital signal from the comparator 122. The comparator 122 may estimate the length of the first transmission line 130 and the first branch line 210 based on the digital signal. To estimate the length of the first transmission line 130 and the first branch line 210, the time calculator 140 may calculate the propagation delay time TPD. The propagation delay time TPD are described with reference to the following Equations 1 through 3.

$$TPD_R = \frac{T_E - T_S}{2} \quad \text{[Equation 1]}$$

Referring to Equation 1. a real propagation delay time $TPD_R$ may be an half value of a time difference between a time point $T_S$ when the test signal is applied to the first transmission line 130 and a time point $T_E$ when the test signal reaches the open end of the first branch line 210. However, the test apparatus 100 may actually calculate the propagation delay time TPD by the same manner as in Equation 2.

$$TPD = \frac{T2 - T1}{2} \quad \text{[Equation 2]}$$

Referring to Equation 2, the propagation delay time TPD may be a half value of a time difference between the second time T2 and the first time T1. The time between the second time T2 and the first time T1 may be a necessary time when the test signal reciprocates, or reflects, once between the first transmission line 130 and the first branch line 210 and reaches the first node A. The test signal reflected from the open end of the first branch line 210 may return to the first node A. Thus, the time between the first time T1 and the second time T2 may be twice a first propagation delay time TPD1 as shown in FIG. 3.

The propagation delay time TPD may be calculated in the following Equation 3.

$$TPD = \frac{T_E - T_S}{2} - (T1 - T_S) + (T2 - T_E) \quad \text{[Equation 3]}$$

Referring to Equation 3, the propagation delay time TPD may be calculated as a sum of '$T2-T_E$' and a value obtained by subtracting '$T1-T_S$' from the real propagation delay time $TPD_R$. '$T1-T_S$' may be a portion of a rise time of the test signal applied to the first transmission line 130. '$T2-T_E$' may be a portion of a rise time of the test signal reflected from the open end of the first branch line 210.

As an example, when the first reference voltage Vref1 is an intermediate value between '0' and the first voltage V1, '$T1-T_S$' may correspond to a half of the rise time of the test signal applied to the first transmission line 130. When the second reference voltage Vref2 is an intermediate value between the first voltage V1 and the second voltage V2, '$T2-T_E$' may correspond to a half of the rise time of the test signal reflected from the open end of the first branch line 210.

As an example, when the first transmission line 130 and the first branch line 210 are ideal lines (e.g., lossless lines), the rise time of the test signal applied to the first transmission line 130 may be the same as the rise time of the test signal reflected from the open end of the first branch line 210. Thus, 'T1-$T_S$' and 'T2-$T_E$' may be the same, and the same result value may be calculated from Equation 2 and Equation 3.

However, since an actual transmission line is not ideal, the rise time of the test signal applied to the first transmission line 130 and the rise time of the test signal reflected from the open end of the first branch line 210 may not be equal. Accordingly, 'T1-$T_S$' and 'T2-$T_E$' may have different values, and thus an error may occur in a value of the propagation delay time TPD. However, when measuring the propagation delay time TPD of each transmission line, the error may be equally applied to the propagation delay time TPD of each of, or at least a plurality of, the transmission lines. Thus, the error may not affect the measurement of the propagation delay time TPD of the transmission line and signal compensation according to the propagation delay time TPD.

The test apparatus 100 may measure the propagation delay time TPD regardless of a signal characteristic of each of a plurality of the transmission lines (e.g., an impedance mismatch of the transmission line). When measuring the real propagation delay time $TPD_R$ as the propagation delay time TPD using Equation 1, logic of a program for measuring the propagation delay time TPD may not be implemented. However, when using Equation 2 (or Equation 3), reference values (e.g., the first reference voltage value Vref1 and the second reference voltage value Vref2) may be set at a level having a noise margin. Thus, Equation 2 (or Equation 3) may measure the propagation delay time TPD regardless of the signal characteristic of the transmission line.

The time calculator 140 may calculate the first propagation delay time TPD1 in the same manner as in Equation 2 (or Equation 3). The time calculator 140 may estimate the length of the first transmission line 130 and the first branch line 210 by the first propagation delay time TPD1. The time calculator 140 may provide information of the first propagation delay time TPD1 to the signal generator 110. The time calculator 140 may store the information of the first propagation delay time TPD1 in the memory 150.

The memory 150 may store the information of the first propagation delay time TPD1. The memory 150 may include a volatile memory or a nonvolatile memory. When the memory 150 includes the volatile memory, the memory 150 may include any one of SRAM, DRAM and SDRAM. When the memory 150 include the nonvolatile memory, the memory 150 may include any one of ROM, PROM, EPROM, EEPROM, flash memory, PRAM, MRAM, RRAM and FRAM.

Figure 4:
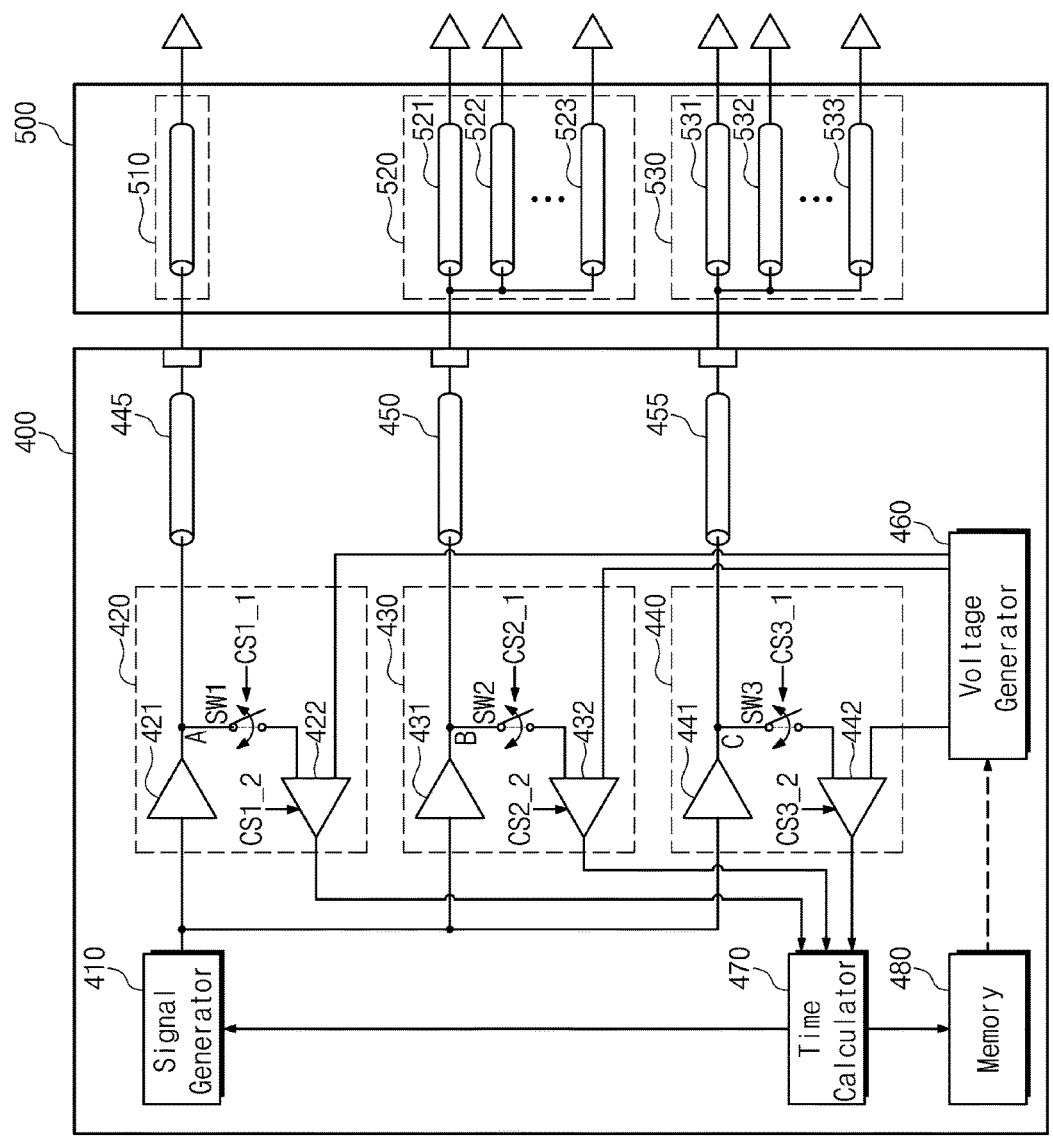
FIG. 4 is a block diagram illustrating a test apparatus and a probe card according to example embodiments of the inventive concepts.

FIG. 4 is a block diagram illustrating a test apparatus and a probe card according to example embodiments.

Referring to FIG. 4, a test apparatus 400 may include a signal generator 410, a first transmission/reception circuit 420, a second transmission/reception circuit 430, a third transmission/reception circuit 440, a first transmission line 445, a second transmission line 450, a third transmission line 455, a voltage generator 460, a time calculator 470 and a memory 480.

A probe card 500 may include a first line group 510, a second line group 520 and a third line group 530. As an example, the first line group 510 may include a single branch line. The second line group 520 may include first through mth branch lines 521, 522 and 523. The third line group 530 may include first through nth branch lines 531, 532 and 533.

In some example embodiments, the number of the first through nth branch lines 531, 532 and 533 in the third line group 530 may be greater than the number of the first through mth branch lines 521, 522 and 523 in the second line group 520.

The signal generator 410 of the test apparatus 400 may output a test signal to each of, or at least a plurality of, the first through third transmission/reception circuits 420, 430 and 440. The test signal may be a signal for estimating a length of the transmission line connecting the test apparatus 400 to each of, or at least a plurality of, the devices under test (DUTs) 310, 320 and 330 (refer to FIG. 1). The signal generator 410 may concurrently output the test signal to the first through third transmission/reception circuits 420, 430 and 440. However, the inventive concepts are not limited thereto. In some embodiments, the signal generator 410 may sequentially output the test signal to the first through third transmission/reception circuits 420, 430 and 440. In other embodiments, the signal generator 410 may output the test signal to at least one of the first through third transmission/reception circuits 420, 430 and 440.

The first transmitting/receiving circuit 420 may include a first amplifier 421, a first switch SW1 and a first comparator 422. The first amplifier 421 may be connected between the signal generator 410 and a first node A. The first amplifier 421 may receive the test signal from the signal generator 410 to amplify the test signal. The first amplifier 421 may transmit the amplified test signal to the first transmission line 445.

The first switch SW1 may be connected between the first comparator 422 and the first node A. The first switch SW1 may be connected or disconnected by a first switch control signal CS1_1. As an example, when measuring a propagation delay time TPD of the first transmission line 445 and the first branch line 510, the first switch SW1 may be connected, and when the measurement of the propagation delay time TPD of the first transmission line 445 and the first branch line 510 is completed, the first switch SW1 may be disconnected.

When the first switch SW1 is connected, the first comparator 422 may detect a voltage generated by the test signal applied from the first node A to the first transmission line 445 and the first branch line 510. A waveform of the voltage detected by the first comparator 422 may be the same as the waveform of the voltage detected by the comparator 122 shown in FIG. 2.

The first comparator 422 may operate based on a first comparator control signal CS1_2. The first comparator control signal CS1_2 may activate the first comparator 422. When the first comparator control signal CS1_2 is received by the first comparator 422, the first comparator 422 may compare a first reference voltage Vref1 or a second reference voltage Vref2 to a voltage of the first node A.

The voltage generator 460 may apply the first reference voltage Vref1 and the second reference voltage Vref2 to the first comparator 422. As an example, referring to FIG. 3, the first reference voltage Vref1 may be a voltage between '0' and a first voltage V1. In some embodiments, the first reference voltage Vref1 may be an intermediate value between '0' and a first voltage V1. The first comparator 422 may measure a time when the voltage of the first node A reaches the first reference voltage Vref1, based on the first comparator control signal CS1_2.

As an example, when the voltage of the first node A is less than the first reference voltage Vref1, the first comparator 422 may output a fail, or "less than," signal to the time calculator 470. When a magnitude of the voltage of the first node A is equal to or greater than a magnitude of the first reference voltage Vref1, the comparator 422 may output a pass, or "greater than," signal to the time calculator 470.

The second reference voltage Vref2 may be a voltage between the first voltage V1 and a second voltage V2. In some embodiments, the second reference voltage Vref2 may be an intermediate value between the first voltage V1 and the second voltage V2. The comparator 422 may measure a time when the voltage of the first node A reaches the second reference voltage Vref2, based on the first comparator control signal CS1_2.

As an example, when the voltage of the first node A is less than the second reference voltage Vref2, the first comparator 422 may output the fail signal to the time calculator 470. When a magnitude of the voltage of the first node A is equal to or greater than a magnitude of the second reference voltage Vref2, the first comparator 422 may output the pass signal to the time calculator 470.

The first comparator 422 may compare each of the first reference voltage Vref1 and the second reference voltage Vref2 with the voltage of the first node A, based on the first comparator control signal CS1_2 and may transmit a comparison result as a digital signal to the time calculator 470.

The time calculator 470 may receive the digital signal from the first comparator 422. The time calculator 470 may measure a first propagation delay time TPD1 of the first transmission line 445 and the first branch line 510 based on the digital signal. The first propagation delay time TPD1 may be the same as the first propagation delay time TPD1 described with reference to FIGS. 2 and 3. The time calculator 470 may provide the first propagation delay time TPD1 to the signal generator 410. The time calculator 470 may store the first propagation delay time TPD1 in the memory 480.

The second transmission/reception circuit 430 may include a second amplifier 431, a second switch SW2 and a second comparator 432. The second amplifier 431 may be connected between the signal generator 410 and a second node B. The second amplifier 431 may receive the test signal form the signal generator 410 to amplify the test signal. The second amplifier 431 may transmit the amplified test signal to the second transmission line 450.

The test signal may be applied to the second transmission line 450 and the first through mth branch lines 521, 522 and 523 of the second line group 520 connected to the second transmission line 450. In this case, one end of each of, or at least a plurality of, the first through mth branch lines 521, 522 and 523 may be connected to the second transmission line 450 and the other end thereof may be an open end.

The second switch SW2 may be connected between the second comparator 432 and the second node B. The second switch SW2 may be connected or disconnected by a second switch control signal CS2_1. As an example, when measuring a propagation delay time of the second transmission line 450 and the first through mth branch lines 521, 522 and 523, the second switch SW2 may be connected, and when the measurement of the propagation delay time of the second transmission line 450 and the first through mth branch lines 521, 522 and 523 is completed, the second switch SW2 may be disconnected.

When the second switch SW2 is connected, the second comparator 432 may detect a voltage generated by the test signal from the second node B. The second comparator 432 may operate based on the second comparator control signal CS2_2. The second comparator control signal CS2_2 may activate the second comparator 432. When the second comparator control signal CS2_2 is received by the second comparator 432, the second comparator 432 may compare the first reference voltage Vref1 or a third reference voltage Vref3 with the voltage of the second node B.

The voltage of the second node B sensed by the second comparator 432 are described in detail with reference to FIG. 5.

Figure 5:
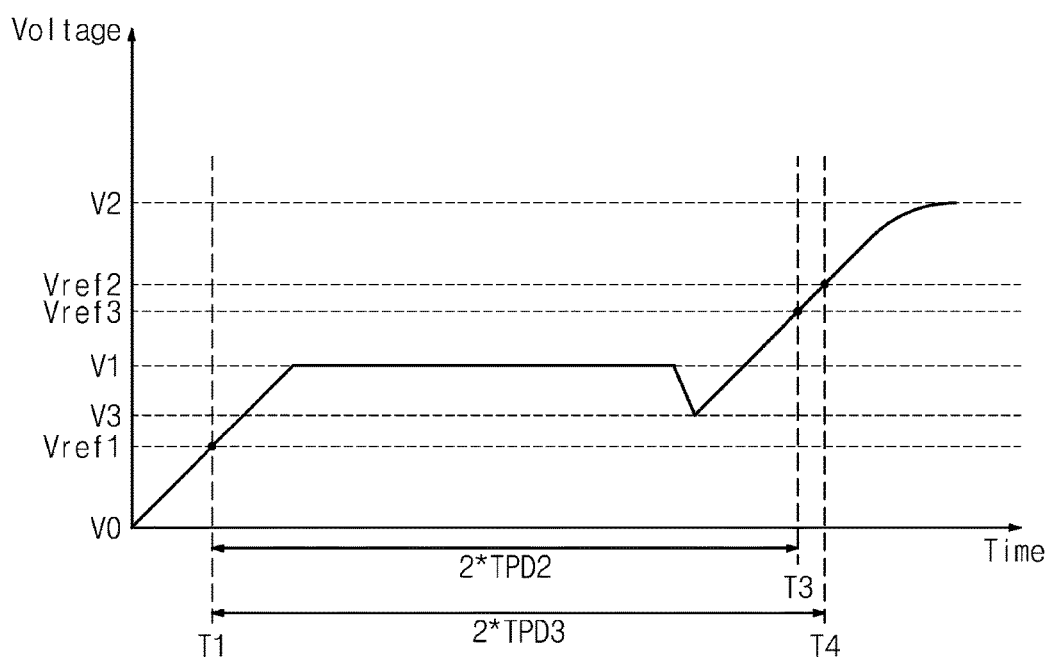
FIG. 5 is a graph illustrating voltages generated from a second transmission line and a second branch line group, which are detected by a second comparator according to example embodiments of the inventive concepts.

FIG. 5 is a graph illustrating voltages generated from the second transmission line 450 and the second line group 520, which are detected by the second comparator 432 of FIG. 4 according to example embodiments.

Referring to FIGS. 4 and 5, when the test signal is applied from the second amplifier 431 to the second node B, a magnitude of the voltage of the second node B may be gradually increase from '0'. The voltage of the second node B may rise to a first voltage V1. The voltage of the second node B may be kept at the first voltage V1 until the test signal reaches the open end of each of, or at least a plurality of, the first through mth branch lines 521, 522 and 523. When the test signal reaches the open end of each of, or at least a plurality of, the first through mth branch lines 521, 522 and 523, the test signal may be reflected. As an example, the voltage of the second node B may decrease from the first voltage V1 to a third voltage V3 by the test signal reflected from each of, or at least a plurality of, the first through mth branch lines 521, 522 and 523. The voltage of the second node B may decrease by a reflection coefficient of the first through mth branch lines 521, 522 and 523. The reflection coefficient may be calculated in the same manner as in the following Equation 4.

$$\lambda = \frac{Z_L - Z_0}{Z_L + Z_0} \quad \text{[Equation 4]}$$

Referring to Equation 4, a reflection coefficient $\lambda$ may be a value obtained by dividing the difference between a total impedance $Z_L$ of the first through mth branch lines 521, 522 and 523 and an impedance $Z_0$ of the second transmission line 450 by the sum of the total impedance $Z_L$ of the first through mth branch lines 521, 522 and 523 and the impedance $Z_0$ of the second transmission line 450. As an example, the impedance $Z_0$ of the second transmission line 450 may be '50Ω', and an impedance of each of, or at least a plurality of, the first through mth branch lines 521, 522 and 523 may be '50Ω'. Since the first through mth branch lines 521, 522 and 523 are connected in parallel, the total impedance $Z_L$ of the first through mth branch lines 521, 522 and 523 may be reduced to '50/m Ω'. Thus, the reflection coefficient $\lambda$ may have a negative value, and a magnitude of the voltage of the second node B may decrease. A total impedance mismatch of the first through mth branch lines 521, 522 and 523 may increase.

The voltage of the second node B may gradually increase from the third voltage V3 to the second voltage V2. Referring to FIGS. 3 and 5, the voltage of the first node A may rise from the first voltage V1 to the second voltage V2, and the voltage of the second node B may rise from the third voltage V3 lower than the first voltage V1 to the second voltage V2. Thus, due to the reflection signal, a magnitude of the voltage rising at the second node B may be greater than a magnitude of the voltage rising at the first node A. Accordingly, a rise time of the voltage from the third voltage V3 to the second voltage V2 may be longer than a rise time of the voltage from the first voltage V1 to the second voltage V2.

Conventionally, reference voltages for measuring the propagation delay times TPD of the transmission lines may be all the same. For example, since the test signal reflected at an open end of the first branch line 510 rises from the first voltage V1 to the second voltage V2, the second reference voltage Vref2 that is an intermediate value between the first voltage V1 and the second voltage V2 may be applied to the first comparator 422. However, since the test signal reflected at the open end of the second line group 520 rises from the third voltage V3 to the second voltage V2, the second reference voltage Vref2 may be greater than an intermediate value between the second voltage V2 and the third voltage V3. Thus, when using the second reference voltage Vref2 for measuring a second propagation delay time TPD2 of the second transmission line 450 and the second line group 520, a ratio of the amplitude of the reflection signal greater than that of the first propagation delay time TPD1 may be reflected to the second propagation delay time TPD2. Thus, the second propagation delay time TPD2 of the second transmission line 450 and the second line group 520 may be measured relatively long compared to the first propagation delay time TPD1.

As an example, when applying the test signal having a voltage of '2 V' to the first amplifier 421, the first voltage V1 of the first node A may rise to '1 V' until before the test signal is reflected at the open end of the first branch line 510. When the test signal is reflected at the open end of the first branch line 510, the voltage of the first node A may rise to '2 V'. In this case, the magnitude of the second reference voltage Vref2 may be '1.5V'.

When applying the test signal having the voltage of '2 V' to the second amplifier 431, the first voltage V1 of the second node B may rise to '1 V' until before the test signal is reflected at the open ends of the first through mth branch lines 521, 522 and 523. When the test signal is reflected at the open ends of the first through mth branch lines 521, 522 and 523, the impedance mismatch from an increase of the number of the branch lines may occur. Thus, the voltage of the second node B may rise from the third voltage V3 lower than the first voltage V1 to the second voltage V2. As an example, when the third voltage V3 is '0.9 V', the second reference voltage Vref2 may have a value corresponding to 54.5% of the difference between the third voltage V3 and the second voltage V2. Thus, the second propagation delay time TPD2 of the second transmission line 450 and the second line group 520 may be measured relatively long compared to the first propagation delay time TPD1.

Referring to Equation 3, a value of 'T2-T$_E$' may be varied depending on the number of the branch lines. For example, the value of 'T2-T$_E$' in the case of the first branch line 510 may be different from the value of 'T2-T$_E$' in the case of the first through mth branch lines 521, 522 and 523. Thus, when measuring the propagation delay time TPD in the same manner as in Equation 3, the propagation delay time TPD may be measured to be less sensitive to the signal characteristic of the transmission line.

The voltage generator 460 may apply the first reference voltage Vref1 and the third reference voltage Vref3 to the second comparator 432. As an example, the first reference voltage Vref1 may be a voltage between '0' and the first voltage V1. In some example embodiments, a magnitude of the first reference voltage Vref1 may be an intermediate value between '0' and the first voltage V1. A first time T1 may be a time point when the voltage measured at the second node B reaches the first reference voltage Vref1.

The second comparator 432 may measure a time when the voltage of the second node B reaches the first reference voltage Vref1, based on the second comparator control signal CS2_2. As an example, when the voltage of the second node B is lower than the first reference voltage Vref1, the second comparator 432 may output the fail signal to the time calculator 470. When the magnitude of the voltage of the second node B is equal to or greater than the magnitude of the first reference voltage Vref1, the second comparator 432 may output the pass signal to the time calculator 470. The third reference voltage Vref3 may be a voltage between the first voltage V1 and the second voltage V2. A magnitude of the third reference voltage Vref3 may be smaller than the magnitude of the second reference voltage Vref2. For example, the magnitude of the third reference voltage Vref3 may be an intermediate value between the third voltage V3 and the second voltage V2. In some embodiments, when the third voltage V3 is '0.9 V' and the second voltage V2 is '2 V', the third reference voltage Vref3 may be '1.45 V'. A third time T3 may be a time point when the voltage measured at the second node B reaches the third reference voltage Vref3.

The second comparator 432 may measure a time when the voltage of the second node B reaches the third reference voltage Vref3, based on the second comparator control signal CS2_2. For example, when the voltage of the second node B is lower than the third reference voltage Vref3, the second comparator 432 may output the fail signal to the time calculator 470. When the magnitude of the voltage of the second node B is equal to or greater than the magnitude of the third reference voltage Vref3, the second comparator 432 may output the pass signal to the time calculator 470.

The second comparator 432 may compare each of, or at least a plurality of, the first reference voltage Vref1 and the third reference voltage Vref3 with the voltage measured at the second node B and may transmit a comparison result as a digital signal to the time calculator 470.

The time calculator 470 may receive the digital signal from the second comparator 432. The time calculator 470 may estimate a length of the second transmission line 450 and the first through mth branch lines 521, 522 and 523 based on the digital signal. The time calculator 470 may calculate the second propagation delay time TPD2 of the first through mth branch lines 521, 522 and 523 to estimate the length of the second transmission line 450 and the first through mth branch lines 521, 522 and 523. A time difference value between the first time T1 and the third time T3 may be a value twice the second propagation delay time TPD2. Thus, the time calculator 470 may calculate a half of the time difference value between the first time T1 and the third time T3 as the second propagation delay time TPD2.

When the voltage generator 460 applies the first reference voltage Vref1 and the second reference voltage Vref2 to the second comparator 432, the voltage of the second node B may reaches the second reference voltage Vref2 at a fourth time T4. Accordingly, the time calculator 470 may calculate the propagation delay time of the second transmission line 450 and the first through mth branch lines 521, 522 and 523 as a third propagation delay time TPD3. A magnitude of the third propagation delay time TPD3 may be greater than a magnitude of the second propagation delay time TPD2. Thus, the length of the second transmission line 450 and the first through mth branch lines 521, 522 and 523 may be estimated to be longer than an actual length thereof. To prevent this happening, the voltage generator 460 may apply the third reference voltage Vref3 instead of the second reference voltage Vref2 to the second comparator 432.

The third transmission/reception circuit 440 may include a third amplifier 441, a third switch SW3 and a third comparator 442. The third amplifier 441 may be connected between the signal generator 410 and a third node C. The third amplifier 441 may receive the test signal from the signal generator 410 to amplify the test signal. The third amplifier 441 may transmit the amplified test signal to the third transmission line 455.

The test signal may be applied to the third transmission line 455 and the first through nth branch lines 531, 532 and 533 of the third line group 530 connected to the third transmission line 455. In this case, one end of each of, or at least a plurality of, the first through nth branch lines 531, 532 and 533 may be connected to the third transmission line 455, and the other end thereof may be an open end.

The third switch SW3 may be connected between the third comparator 442 and the third node C. The third switch SW3 may be connected or disconnected by a third switch control signal CS3_1. As an example, when measuring a propagation delay time TPD of the third transmission line 455 and the first through nth branch lines 531, 532 and 533, the third switch SW3 may be connected, and when the measurement of the propagation delay time TPD of the third transmission line 455 and the first through nth branch lines 531, 532 and 533 is completed, the third switch SW3 may be disconnected.

When the third switch SW3 is connected, the third comparator 442 may detect a voltage generated by the test signal from the third node C. The third comparator 442 may operate based on a third comparator control signal CS3_2. The third comparator control signal CS3_2 may activate the third comparator 442. When the third comparator control signal CS3_2 is received by the third comparator 442, the third comparator 442 may compare the first reference voltage Vref1 or a fourth reference voltage Vref4 with the voltage of the third node C.

The voltage of the third node C sensed by the third comparator 442 is described in detail with reference to FIG. 6.

Figure 6:
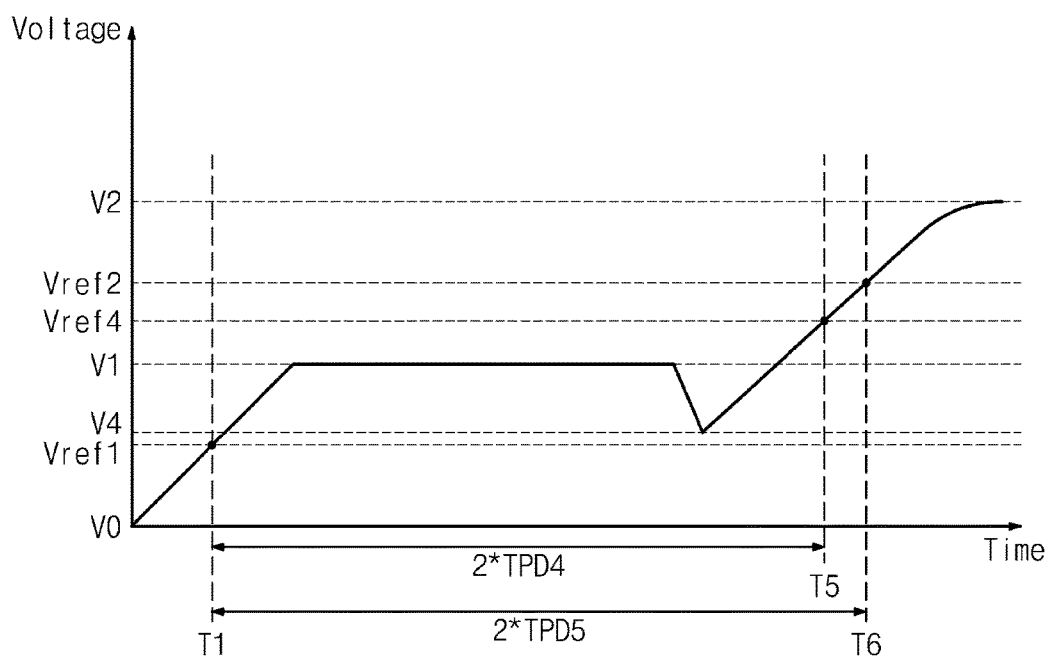
FIG. 6 is a graph illustrating voltages generated from a third transmission line and a third branch line group, which are detected by a third comparator according to example embodiments of the inventive concepts.

FIG. 6 is a graph illustrating voltages of the third transmission line 455 and the third line group 530, which are detected by the third comparator 442 of FIG. 4 according to example embodiments.

Referring to FIGS. 4 and 6, a test signal may be applied from the third amplifier 441 to the third node C, and a magnitude of the voltage of the third node C may gradually increase from '0'. The voltage of the third node C may rise to a first voltage V1. The voltage of the third node C may be kept at the first voltage V1 until the test signal reaches an open end of each of, or at least a plurality of, the first through nth branch lines 531, 532 and 533. When the test signal reaches the open end of each of, or at least a plurality of, the first through nth branch lines 531, 532 and 533, the test signal may be reflected. As an example, by the test signal reflected from each of, or at least a plurality of, the first through nth branch lines 531, 532 and 533, the voltage of the third node C may decrease from the first voltage V1 to a fourth voltage V4. The voltage of the third node C may decrease by a reflection coefficient λ of the first through nth branch lines 531, 532 and 533. The reflection coefficient λ may be calculated in the same or similar manner as in Equation 2.

As an example, an impedance $Z_O$ of the third transmission line 455 may be '50Ω', and an impedance of each of, or at least a plurality of, the first through nth branch lines 531, 532 and 533 may be '50Ω'. Since the first through nth branch lines 531, 532 and 533 are connected in parallel, a total impedance $Z_L$ of the first through nth branch lines 531, 532 and 533 may decrease to '50Ω'. Thus, the reflection coefficient λ may have a negative value, and the magnitude of the voltage of the third node C may be reduced.

In some embodiments, the number of the first through nth branch lines 531, 532 and 533 may be greater than number of the first through mth branch lines 521, 522 and 523. Thus, the total impedance $Z_L$ of the first through nth branch lines 531, 532 and 533 may be smaller than the total impedance $Z_L$ of the first through mth branch lines 521, 522 and 523. For example, a total impedance mismatch of the first through nth branch lines 531, 532 and 533 may be greater than the total impedance mismatch of the first through mth branch lines 521, 522 and 523. Accordingly, the fourth voltage V4 may be lower than the third voltage V3. The voltage of the third node C may gradually increase from the fourth voltage V4 to the second voltage V2. Referring to FIGS. 3 and 6, a rise time of the voltage from the fourth voltage V4 to the second voltage V2 may be longer than the rise time of the voltage from the first voltage V1 to the second voltage V2.

The voltage generator 460 may apply the first reference voltage Vref1 to the third comparator 442 and may apply the fourth reference voltage Vref4 instead of the second reference voltage Vref2 to the third comparator 442. As an example, the magnitude of the first reference voltage Vref1 may be an intermediate value between '0' and the first voltage V1. A first time T1 may be a time point when the voltage measured at the third node C reaches the first reference voltage Vref1.

The third comparator 442 may measure a time when the voltage of the third node C reaches the first reference voltage Vref1, based on the third comparator control signal CS3_2. As an example, when the voltage of the third node C is lower than the first reference voltage Vref1, the third comparator 442 may output the fail signal to the time calculator 470. When a magnitude of the voltage of the third node C is equal to or greater than the magnitude of the first reference voltage Vref1, the third comparator 442 may output the pass signal to the time calculator 470.

The fourth reference voltage Vref4 may be a voltage between the first voltage V1 and the second voltage V2. A magnitude of the fourth reference voltage Vref4 may be smaller than the magnitude of the second reference voltage Vref2. For example, the magnitude of the fourth reference voltage Vref4 may be an intermediate value between the third voltage V3 and the second voltage V2. A fifth time T5 may be a time point when the voltage measured at the third node C reaches the fourth reference voltage Vref4.

The third comparator 442 may measure a time when the voltage of the third node C reaches the fourth reference voltage Vref4, based on the third comparator control signal CS3_2. As an example, when the voltage of the third node C is lower than the fourth reference voltage Vref4, the third comparator 442 may output the fail signal to the time calculator 470. When the magnitude of the voltage of the third node C is equal to or greater than the fourth reference voltage Vref4, the third comparator 442 may output the pass signal to the time calculator 470.

The third comparator 442 may compare each of, or at least a plurality of, the first reference voltage Vref1 and the fourth reference voltage Vref4 with the voltage measured at the third node C and may transmit a comparison result as a digital signal to the time calculator 140.

As an example, the first through third switch control signals CS1_1, CS2_1 and CS3_1 and the first through third comparator control signals CS1_2, CS2_2 and CS3_3 may be generated from the voltage generator 160, but the inventive concepts are not limited there to. For example, the first through third switch control signals CS1_1, CS2_1 and CS3_1 and the first through third comparator control signals CS1_2, CS2_2 and CS3_3 may be generated outside the test apparatus 400.

The time calculator 470 may receive the digital signal from the third comparator 442. The third comparator 442 may estimate a length of the third transmission line 455 and the first through nth branch lines 531, 532 and 533. The time calculator 470 may calculate a fourth propagation delay time TPD4 of the third transmission line 455 and the first through nth branch lines 531, 532 and 533 to measure the length of the third transmission line 455 and the first through nth branch lines 531, 532 and 533. A time difference value between the first time T1 and the fifth time T5 may be a value twice the fourth propagation delay time TPD4. Thus, the time calculator 470 may calculate a half of the time difference value between the first time T1 and the fifth time T5 as the fourth propagation delay time TPD4.

When the voltage generator 460 apply the first reference voltage Vref1 and the second reference voltage Vref2 to the third comparator 442, a time when the voltage measured at the third node C reaches the second reference voltage Vref2 may be a sixth time T6. In this case, the time calculator 470 may calculate the propagation delay time TPD of the third transmission line 455 and the first through nth branch lines 531, 532 and 533 as a fifth propagation delay time TPD5. A magnitude of the fifth propagation delay time TPD5 may be greater than the magnitude of the second propagation delay time TPD2. Thus, the length of the third transmission line 455 and the first through nth branch lines 531, 532 and 533 may be estimated longer than an actual length thereof. To mitigate this happening, the voltage generator 460 may apply the fourth reference voltage Vref4 instead of the second reference voltage Vref2 to the third comparator 442.

The voltage generator 460 may include information on the second through fourth reference voltages Vref2, Vref3 and Vref4. The second through fourth reference voltages Vref2, Vref3 and Vref4 may be used to measure the propagation delay times of the first through third transmission lines 445, 450 and 455 and the first through third line groups 510, 520 and 530 connected to the first through third transmission lines 445, 450 and 455, respectively. The information on the second through fourth reference voltages Vref2, Vref3 and Vref4 are described with reference to FIG. 7.

FIG. 7 illustrates a table for reference when generating the reference voltage from the voltage generator 460 of FIG. 4 according to example embodiments.

Referring to FIGS. 4 and 7, a voltage table VT may include information on the second reference voltage Vref2 for the first transmission line 445, information on the third reference voltage Vref3 for the second transmission line 450 and information on the fourth reference voltage Vref4 for the third transmission line 455.

The second reference voltage Vref2 may be applied to the first comparator 422. The third reference voltage Vref3 may be applied to the second comparator 432. The fourth reference voltage Vref4 may be applied to the third comparator 442.

In some embodiments, the voltage table VT may be stored in the voltage generator 460 by a user of the test apparatus 400. In other embodiments, the voltage table VT may be stored in the memory 480 by the user of the test apparatus 400. The voltage generator 460 may read the voltage table VT from the memory 480. The voltage table VT may be periodically updated. When the probe card 500 is replaced, the voltage table VT may be periodically updated by the user of the test apparatus 400.

As described above, the test apparatus 400 according to example embodiments of the inventive concepts may measure the propagation delay times TPD of the first through third transmission lines 445, 450 and 455 and the first through third line groups 510, 520 and 530 respectively connected to the first through third transmission lines 445, 450 and 455, using the second through fourth reference voltages Vref2, Verf3 and Verf4 different from each other.

The test apparatus 400 may estimate the lengths of the first through third transmission lines 445, 450 and 455 and the first through third line groups 510, 520 and 530 respectively connected to the first through third transmission lines 445, 450 and 455, based on the propagation delay times TPD. The test apparatus 400 may apply different reference voltages to the first through third transmission lines 445, 450 and 455. Thus, the test apparatus 400 may more accurately estimate the lengths of the first through third transmission lines 445, 450 and 455 and the first through third line groups 510, 520 and 530 respectively connected to the first through third transmission lines 445, 450 and 455.

FIG. 8 is a flow chart illustrating a method of operating the test apparatus of FIG. 2 according to example embodiments.

Referring to FIGS. 2 and 8, in operation S110, the voltage generator 160 of the test apparatus 100 may apply a first reference voltage Vref1 to the comparator 122. In operation S120, the comparator 122 may compare the first reference voltage Vref1 with a voltage sensed at the first node A. As an example, when the voltage of the first node A reaches the first reference voltage Vref1, the comparator 122 may output a pass signal. In operation S130, the voltage generator 160 of the test apparatus 100 may generate a second reference voltage Vref2 by referring to the voltage table VT (refer to FIG. 7). In operation S140, the voltage generator 160 of the test apparatus 100 may apply the second reference voltage Vref2 to the comparator 122.

In operation S150, the comparator 122 may compare the second reference voltage Vref2 with the voltage sensed at the first node A. As an example, the comparator 122 may output the pass signal when the voltage of the first node A reaches the second reference voltage Vref2.

In operation S160, the test apparatus 100 may measure a propagation delay time TPD of the transmission line. As an example, the time calculator 140 of the test apparatus 100 may calculate the propagation delay time TPD using a first time T1 and a second time T2 which each are a reception time of the pass signal received from the comparator 122. The first time T1 may be a time point when the voltage of the first node A reaches the first reference voltage Vref1, and the second time T1 may be a time point when the voltage of the first node A reaches the second reference voltage Vref2.

Figure 9:
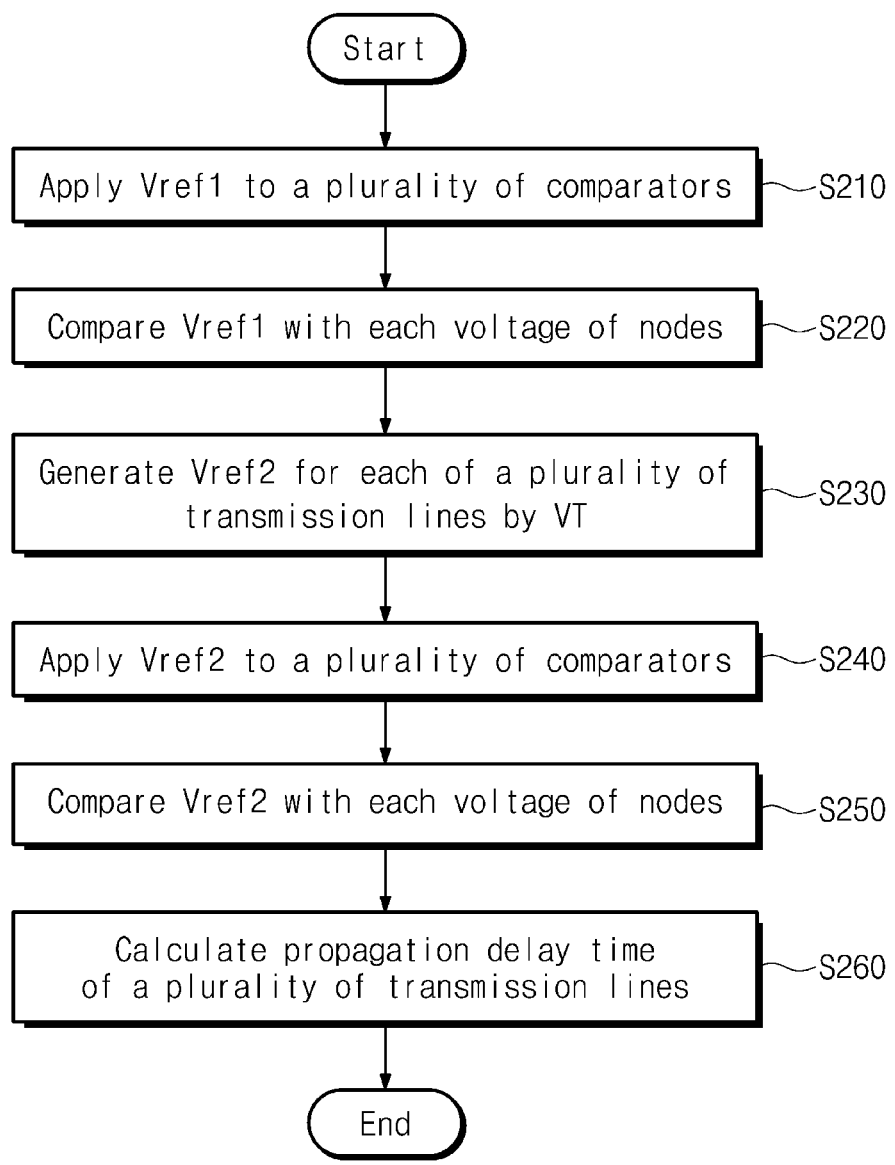
FIG. 9 is a flow chart illustrating a method of operating a test apparatus according to example embodiments of the inventive concepts.

FIG. 9 is a flow chart illustrating a method of operating the test apparatus in FIG. 4 according to example embodiments.

Referring to FIGS. 4 and 9, in operation S210, the voltage generator 460 of the test apparatus 400 may apply a first reference voltage Vref1 to each of, or at least a plurality of, the first through comparators 422, 432 and 442. In operation S220, each of, or at least a plurality of, the first through third comparators 422, 432 and 442 may compare the first reference voltage Vref1 with a voltage sensed at a corresponding one of first through third nodes A, B and C. The first through third comparators 422, 432 and 442 may each output a pass signal when the voltage of the corresponding one of the first through third nodes A, B and C reaches the first reference voltage Vref1.

In operation S230, the voltage generator 460 of the test apparatus 400 may generate a second reference voltage Vref2 for each of, or at least a plurality of, the first through third transmission lines 445, 450 and 455 by referring to the voltage table VT (refer to FIG. 7). As an example, the voltage table VT may be stored in one of the voltage generator 460 and the memory 480. The second reference voltage Vref2 for the respective first through third transmission lines 445, 450 and 455 may have the same, or different, voltage levels.

In operation S240, the voltage generator 460 of the test apparatus 400 may apply the second reference voltage Vref2 to each of, or at least a plurality of, the first through third comparators 422, 432 and 442.

In operation S250, the first through third comparators 422, 432 and 442 may each compare the second reference voltage Vref2 with the voltage sensed by a corresponding one of the first through third nodes A, B and C. The first through third comparators 422, 432 and 442 may each output the pass signal when the voltage of the corresponding one of the first through third nodes A, B and C reaches the second reference voltage Vref2.

In operation S260, the test apparatus 400 may calculate propagation delay times of the transmission lines. As an example, the time calculator 470 of the test apparatus 400 may calculate the propagation delay time TPD of each of, or at least a plurality of, the first through third transmission lines 445, 450 and 455 and each of, or at least a plurality of, the first through third line groups 510, 520 and 530 connected to a corresponding one of the first through third transmission lines 445, 450 and 455, based on a reception time of the pass signal received from each of, or at least a plurality of, the first through third comparators 422, 432 and 442.

Figure 10:
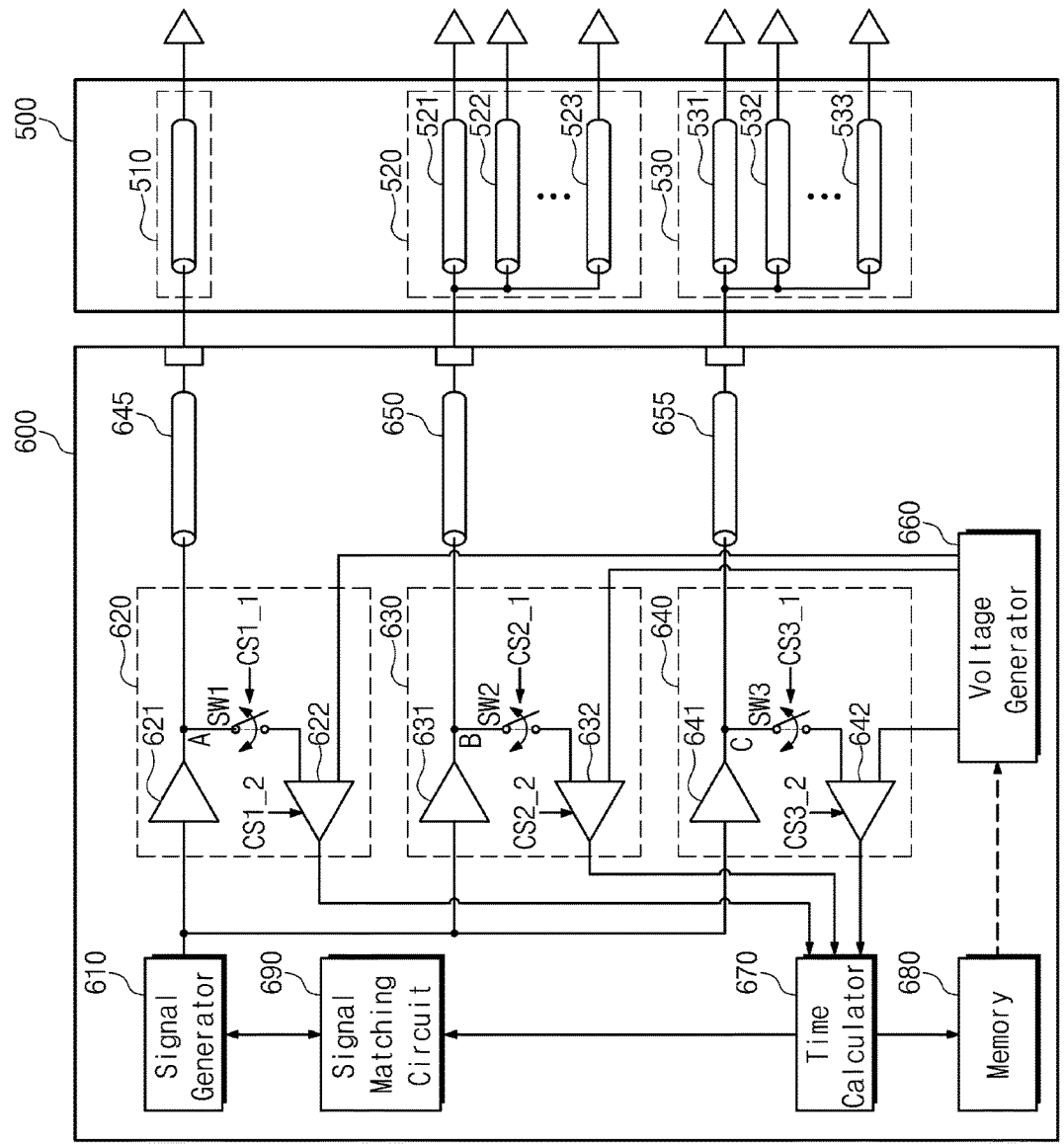
FIG. 10 is a block diagram illustrating a test apparatus and a probe card according to example embodiments of the inventive concepts.

FIG. 10 is a block diagram illustrating a test apparatus and a probe card according to example embodiments.

Referring to FIG. 10, the test apparatus 600 may include a signal generator 610, a first transmission/reception circuit 620, a second transmission/reception circuit 630, a third transmission/reception circuit 640, a first transmission line 645, a second transmission line 650, a third transmission line 655, a voltage generator 660, a time calculator 670, a memory 680 and a signal matching circuit 690.

The test apparatus 600 of FIG. 10 may further include the signal matching circuit 690 compared to the test apparatus 400 of FIG. 4. The signal generator 610, the first transmission/reception circuit 620, the second transmission/reception circuit 630, the third transmission/reception circuit 640, the first transmission line 645, the second transmission line 650, the third transmission line 655, the voltage generator 660, the time calculator 670 and the memory 680 in the test apparatus 600 may be the same as, or similar to, the signal generator 410, the first transmission/reception circuit 420, the second transmission/reception circuit 430, the third transmission/reception circuit 440, the first transmission line 445, the second transmission line 450, the third transmission line 455, the voltage generator 460, the time calculator 470 and the memory 480. Thus, detailed descriptions thereto are not omitted. A probe card 500 of FIG. 10 may be the same as, or similar to, the probe card 500 of FIG. 4, and thus detailed descriptions thereto are not omitted.

The signal matching circuit 690 may receive information on first, second and fourth propagation delay times TPD1, TPD2 and TPD4 from the time calculator 670. In some embodiments, the signal matching circuit 690 may read information on the first, second and fourth propagation delay times TPD1, TPD2 and TPD4 from the memory 680. The signal matching circuit 690 may control the signal generator 610 based on the first, second and fourth propagation delay times TPD1, TPD2 and TPD4. The signal matching circuit 690 may control output timings of test signals generated from the signal generator 610. The test signals output from the signal generator 610 are described in detail with reference to FIGS. 11 and 12.

Figure 11:
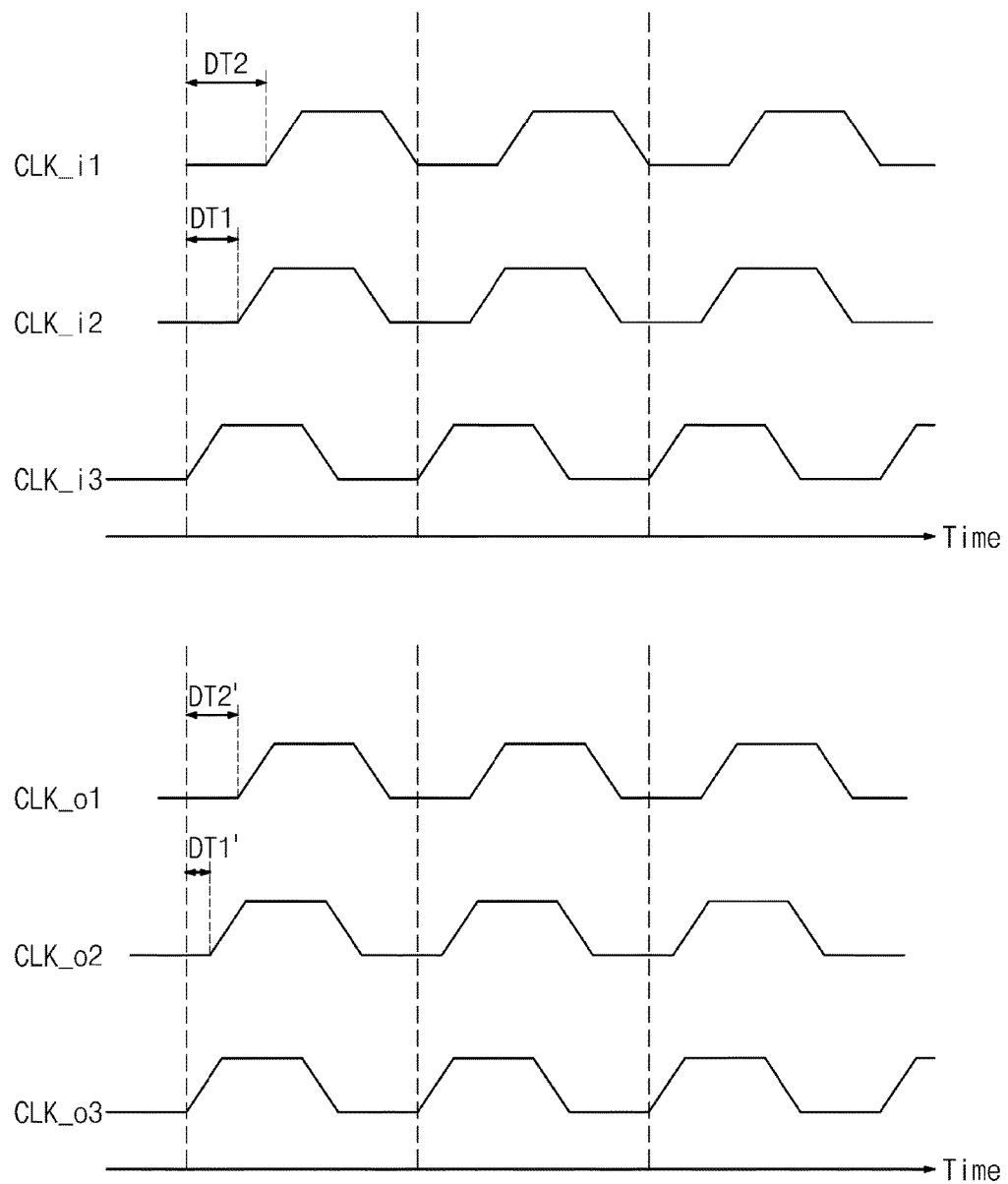
FIG. 11 is a graph illustrating test signals generated from a signal generator when lengths of transmission lines are estimated by a same reference voltage according to example embodiments of the inventive concepts.

FIG. 11 is a graph illustrating test signals generated from a signal generator when lengths of transmission lines are estimated by a same reference voltage according to example embodiments.

Referring to FIGS. 1, 10 and 11, the test apparatus 600 may adjust the output timings of the test signals to concurrently transmit the test signals to the first through third devices under test (DUTs) 310, 320 and 330.

As an example, the voltage generator 660 may apply the first reference voltage Vref1 and the second voltage Vref2 to each of, or at least a plurality of, the first through comparators 622, 632 and 642. Referring to FIGS. 3, 4, 5 and 6, the time calculator 670 may calculate the first propagation delay time TPD1 for a first transmission line 645 and a first branch line 510. The time calculator 670 may calculate a third propagation delay time TPD3 for a second transmission line 650 and first through mth branch lines 521, 522 and 523. Additionally, the time calculator 670 may calculate a fifth propagation delay time TPD5 for a third transmission line 655 and first through nth branch lines 531, 532 and 533

In this case, since the third transmission line 655 and the first through nth branch lines 531, 532 and 533 may include more branch lines than the second transmission line 650 and first through mth branch lines 521, 522 and 523, 'T2-$T_E$' in Equation 3 may be increased. Thus, the fifth propagation delay time TPD5 may be measured longer than the third propagation delay time TPD3. The third propagation delay time TPD3 may be measured longer than the first propagation delay time TPD1. The signal matching circuit 690 may adjust output timings of first through third input clock signals CLK_i1, CLK_i2 and CLK_i3 generated from the signal generator 610 based on the first, third and fifth propagation delay times TPD1, TPD3 and TPD5.

Since the fifth propagation delay time TPD5 is the longest, the signal generator 610 may first apply the third input clock signal CLK_i3 to the third transmission/reception circuit 640. Then, after a first delay time DT1, the signal generator 610 may apply the second input clock signal CLK_i2 to the second transmission/reception circuit 630. Finally, after a second delay time DT2, the signal generator 610 may apply the first input clock signal CLK_i1 to the first transmission/reception circuit 620.

The first through third input clock signals CLK_i1, CLK_i2 and CLK_i3 passing through the probe card 500 may be applied to the DUTs 310, 320 and 330 as first through third output clock signals CLK_o1, CLK_o2 and CLK_o3, respectively. In this case, the first through third output clock signals CLK_o1, CLK_o2 and CLK_o3 may each be concurrently applied to the DUTs 310, 320 and 330.

However, when the same reference voltage (e.g., the first reference voltage Vref1 and the second reference voltage Vref2) is applied to each of, or at least a plurality of, the first through third comparators 622, 632 and 642, lengths of the transmission lines may not be exactly estimated. Therefore, the second output clock signal CLK_o2 may be output later by a first output delay time DT1' than the third output clock signal CLK_o3. The first output clock signal CLK_o1 may be output later by a second output delay time DT2' than the third output clock signal CLK_o3.

Figure 12:
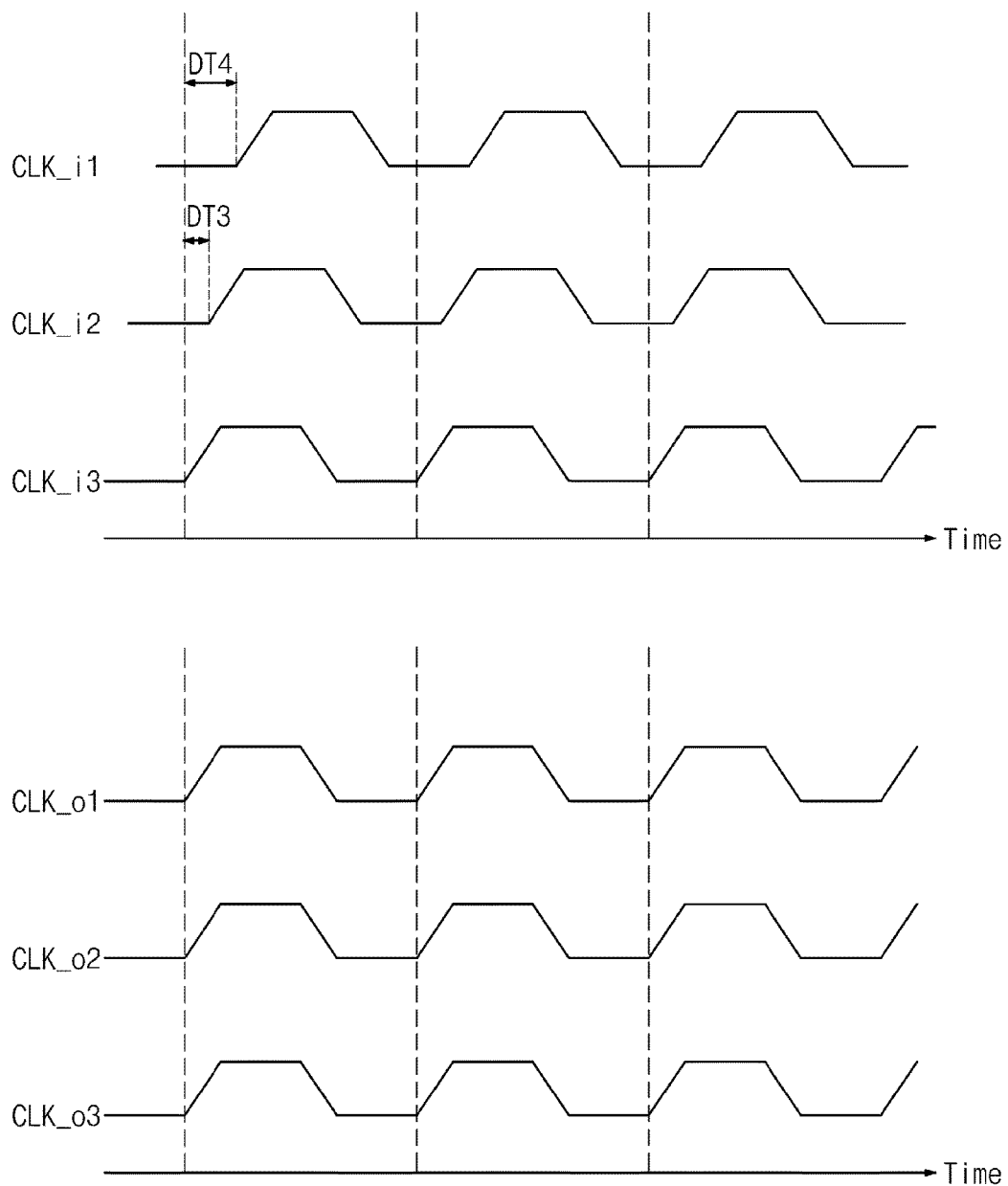
FIG. 12 is a graph illustrating test signals generated from a signal generator when lengths of transmission lines are estimated by different reference voltages according to example embodiments of the inventive concepts.

FIG. 12 is a graph illustrating test signals generated from a signal generator when lengths of transmission lines are estimated by different reference voltages according to example embodiments of the inventive concepts.

Referring to FIGS. 1, 10 and 12, the voltage generator 660 may apply the first reference voltage Vref1 and the second reference voltage Vref2 to the first comparator 622 and may apply the first reference voltage Vref1 and the third reference voltage Vref3 to the second comparator 632. The voltage generator 660 may apply the first reference voltage Vref1 and the fourth reference voltage Vref4 to the third comparator 642.

The time calculator 670 may calculate the first propagation delay time TPD1 for the first transmission line 645 and the first branch line 510 and may calculate the second propagation delay time TPD2 for the second transmission line 650 and the first through mth branch lines 521, 522 and 523. The time calculator 670 may calculate the fourth propagation delay time TPD4 for the third through nth branch lines 531, 532 and 533. In this case, a method of measuring the first propagation delay time TPD1, the second propagation delay time TPD2 and the fourth propagation delay time TPD4 may be substantially the same as the method of measuring the first propagation delay time TPD1, the second propagation delay time TPD2 and the fourth propagation delay time TPD4 in the test apparatus 400 of FIG. 4. The fourth propagation delay time TPD4 may be longer than the second propagation delay time TPD2, and the second propagation delay time TPD2 may be longer than the first propagation delay time TPD1. The signal matching circuit 690 may adjust the output timings of the first through third input clock signals CLK_i1, CLK_i2 and CLK_i3 generated from the signal generator 610 based on the first propagation delay time TPD1, the second propagation delay time TPD2 and the fourth propagation delay time TPD4.

Since the fourth delay time TPD4 is the longest, the signal generator 610 may first apply the third input clock signal CLK_i3 to the third transmission/reception circuit 640. Then, after a third delay time DT3, the signal generator 610 may apply the second input clock signal CLK_i2 to the second transmission/reception circuit 630. Finally, after a fourth delay time DT4, the signal generator 610 may apply the first input clock signal CLK_i1 to the first transmission/reception circuit 620.

The first through third input clock signals CLK_i1, CLK_i2 and CLK_i3 passing through the probe card 500 may be applied to the devices under test (DUTs) 310, 320 and 330 as first through output third clock signals CLK_o1, CLK_o2 and CLK_o3, respectively. The first through third output clock signals CLK_o1, CLK_o2 and CLK_o3 may each be concurrently applied to the DUTs 310, 320 and 330. The first through third output clock signals CLK_o1, CLK_o2 and CLK_o3 may be output with a smaller delay time than DT2' and DT1'. As described above, the test apparatus 600 according to example embodiments of the inventive concepts may estimate the lengths of the transmission lines using the different reference voltages, and thus the estimation accuracy may be enhanced.

Figure 13:
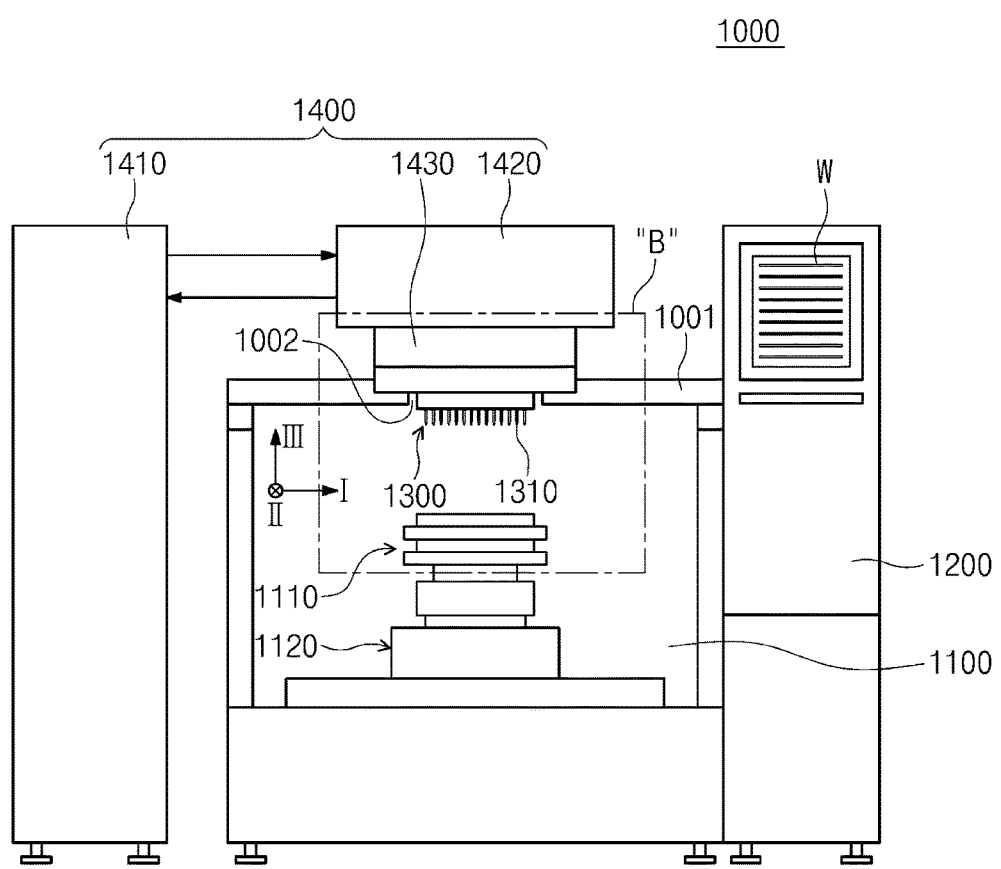
FIG. 13 is a view illustrating a semiconductor test system according to example embodiments of the inventive concepts.

FIG. 13 is a view illustrating a semiconductor test system according to example embodiments.

Referring to FIG. 13, a semiconductor test system 1000 may include a probe chamber 1100, a loader chamber 1200, a probe card 1300 and a test apparatus 1400.

The probe chamber 1100 may provide a room for testing an electrical characteristic of a semiconductor device. The loader chamber 1200 may be disposed at one side of the probe chamber 1100. The loader chamber 1200 may accommodate a wafer W to be tested and may transfer the wafer W to the probe chamber 1100. A chuck 1110 may be disposed in the probe chamber 1100. The probe card 1300 may be provided in a hole 1002 in a top wall 1001 of the probe chamber 1100 to face the chuck 1110. The wafer W transferred from the loader chamber 1200 may be provided on the chuck 1110. The wafer W may be seated on the chuck 1110 in a state in which a main surface of the wafer W on which electrode terminals of the semiconductor device are formed faces upward.

The chuck 1110 may be installed on a transfer member 1120. The chuck 1110 may fix the wafer W by vacuum adsorption. Sandpaper may be placed on a side of the chuck 1110. The sandpaper may have a predetermined roughness. When foreign matter is stuck to ends of probes 1310 of the probe card 1300, the foreign matter may be removed by sanding the ends of probes 1310 to the sandpaper.

The transfer member 1120 may linearly move the chuck 1110 in a horizontal direction I and II and a vertical direction III and may rotate the chuck 1110 with respect to a magnetic center axis vertical to the main surface of the wafer W. Herein, the horizontal direction I and II may be a direction in which semiconductor devices are arranged on the main surface of the wafer W, and the vertical direction III may be a direction vertical to the main surface of the wafer W.

The transfer member 1120 may rotate the chuck 1110, and thus an array direction of the electrode terminals of the semiconductor device on the wafer W may be aligned in an array direction of the probes 1310 of the probe card 1300. When the transfer member 1120 moves the chuck 1110 in the horizontal direction I and II, the electrode terminals of the semiconductor device on the wafer W may be aligned under the probes 1310 of the probe card 1300. When the transfer member 1120 linearly moves the chuck 1110 in the vertical direction III, the electrode terminals of the semiconductor device on the wafer W may physically contact the probes 1310 of the probe card 1300. A contact mark may be formed on the electrode terminals of the semiconductor device by the physical contact between the electrode terminals and the probes 1310.

The test apparatus 1400 may include tester components including a tester body 1410 and a tester head 1420. The tester body 1410 may be on the other side of the probe chamber 1100. The tester body 1410 may output an electrical signal to test the semiconductor device. The tester body 1410 may determine whether the semiconductor device normally operates or not, based on an electrical signal of the test result. The tester components may include a processor configured to execute machine readable instructions for measuring a propagation delay time TPD from the test apparatus 1400 to the probes 1310. The tester components may measure the propagation delay time TPD as described with reference to FIGS. 1 through 12.

The tester head 1420 may be electrically connected to the tester body 1410. The tester body 1410 may include a base unit 1430 coupled to the probe card 1300, and the tester head 1420 may transmit an electrical signal between the probe card 1300 coupled to the base unit 1430 and the tester body 1410. The wafer W may be transferred from the loader chamber 1200 to the probe chamber 1100. The wafer W transferred to the probe chamber 1100 may be placed on the chuck 1110.

The transfer member 1120 may rotate and horizontally move the chuck 1110 such that the electrode terminals of the semiconductor device on the wafer W may be aligned with the probes 1310 of the probe card 1300. The transfer member 1120 may vertically move the chuck 1110 such that the electrode terminals of the semiconductor device may contact the probes 1310 of the probe card 1300.

The tester body 1410 may output the electrical signal necessary for testing the electrical characteristic of the semiconductor device. The tester head 1420 may transmit the output electrical signal of the tester body 1410 to the probe card 1300. The electrical signal transmitted to the probe card 1300 may be applied to the semiconductor device through the electrode terminals in contact with the probes 1310. The semiconductor device may perform an operation depending on the applied electrical signal and may output the electrical signal of the test result through the electrode terminals.

The electrical signal of the test result output from the electrode terminals may be transmitted to the probe card 1300 through the probes 1310 in contact with the electrode terminals. The probe card 1300 may transmit the electrical signal of the test result to the tester head 1420. The tester body 1410 may receive the electrical signal of the test result from the tester head 1420 and may determine whether the semiconductor device normally operates or not.

The test apparatus according to example embodiments of the inventive concepts may accurately measure the lengths of the transmission lines by measuring the propagation delay times of the transmission lines using the different voltages.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A test system comprising:
   a signal generator configured to generate a test signal;
   a first transmission line and at least one first branch line connected to the first transmission line;
   a first transmission/reception circuit connected to the first transmission line, the first transmission/reception circuit configured to provide the test signal to the first transmission line and the at least one first branch line and to detect a first response signal corresponding to the test signal from the first transmission line and the at least one first branch line;
   a second transmission line and at least two second branch lines connected to the second transmission line, the at least two second branch lines including a greater number of branch lines than the at least one first branch line;
   a second transmission/reception circuit connected to the second transmission line, the second transmission/reception circuit configured to provide the test signal to the second transmission line and the at least two second branch lines and to detect a second response signal corresponding to the test signal from the second transmission line and the at least two second branch lines; and
   a voltage generator configured to supply a first reference voltage and a second reference voltage greater than the first reference voltage to the first transmission/reception circuit and to supply the first reference voltage and a third reference voltage greater than the first reference voltage and less than the second reference voltage to the second transmission/reception circuit.

2. The test system according to claim 1, wherein the first transmission/reception circuit includes:
   a first amplifier connected to a first node between the signal generator and the first transmission line, the first amplifier configured to amplify and output the test signal; and
   a first comparator configured to compare a voltage of the first transmission line and the at least one first branch line generated by the test signal and the first response signal from the first node with the first reference voltage and the second reference voltage to generate and output a first digital signal.

3. The test system according to claim 2, wherein the second transmission/reception circuit includes:
   a second amplifier connected to a second node between the signal generator and the second transmission line, the second amplifier configured to amplify and output the test signal; and
   a second comparator configured to compare a voltage of the second transmission line and the at least two second branch lines generated by the test signal and the second response signal from the second node with the first reference voltage and the third reference voltage to generate and output a second digital signal.

4. The test system according to claim 3, further comprising:
   a time calculation circuit configured to calculate a first propagation delay time of the first transmission line and the at least one first branch line based on the first digital signal and to calculate a second first propagation delay time of the second transmission line and the at least two second branch lines based on the second digital signal.

5. The test system according to claim 3, further comprising:
   a third transmission line and at least three third branch lines connected to the third transmission line, the at least three third branch lines including a greater number of branch lines than the at least two second branch lines; and
   a third transmission/reception circuit connected to the third transmission line, the third transmission/reception circuit configured to provide the test signal to the third transmission line and the at least three third branch lines and to detect a third response signal corresponding to the test signal from the third transmission line and the at least three third branch lines.

6. The test system according to claim 5, wherein the voltage generator is configured to supply the first reference voltage and a fourth reference voltage greater than the first reference voltage and less than the third reference voltage to the third transmission/reception circuit.

7. The test system according to claim 6, wherein the voltage generator is configured to update the first reference voltage, the second reference voltage, the third reference voltage and the fourth reference voltage.

8. A test system comprising:
   a signal generator configured to generate a test signal;
   a plurality of transmission lines including a main line and at least one branch line connected to the main line;
   a plurality of transmission/reception circuits configured to provide the test signal to the transmission lines, the transmission/reception circuits configured to detect a response signal corresponding to the test signal from at least one of the plurality of transmission lines; and a voltage generator configured to supply a first reference voltage and one of a second reference voltage and a third reference voltage to at least one of the transmission/reception circuits, the second reference voltage being greater than the first reference voltage and the third reference voltage being greater than the first reference voltage and less than the second reference voltage.

9. The test system according to claim 8, wherein the transmission/reception circuits include a first transmission/reception circuit and the transmission lines include a first transmission line including a first main line and a at least one first branch line connected to the first main line,
wherein the first transmission/reception circuit is connected to the first transmission line, and
the voltage generator is configured to supply the first reference voltage and the second reference voltage to the first transmission/reception circuit.

10. The test system according to claim 9, wherein the transmission/reception circuits include a second transmission/reception circuit and the transmission lines include a second transmission line including a second main line and at least two second branch lines connected to the second main line, the at least two second branch lines including a greater number of branch lines than the first branch line,
the second transmission/reception circuit is connected to the second transmission line, and
the voltage generator is configured to supply the first reference voltage and the third reference voltage to the second transmission/reception circuit, the third reference voltage being less than the second reference voltage.

11. The test system according to claim 8, wherein at least one of the transmission/reception circuits includes:
an amplifier connected between the signal generator and the main line, the amplifier configured to amplify and output the test signal;
a comparator configured to compare the first reference voltage and one of the second reference voltage and the third reference voltage with the response signal to generate and output a digital signal; and
a switch connected between the amplifier and the comparator, the switch configured to control the response signal.

12. The test system according to claim 11, further comprising:
a time calculation circuit configured to calculate a propagation delay time of at least one of the transmission lines connected to a corresponding at least one of the transmission/reception circuits.

13. The test system according to claim 12, further comprising:
a memory configured to store the propagation delay time of at least one of transmission lines.

14. The test system according to claim 13, wherein the memory is configured to store values of the first reference voltage, the second reference voltage and the third reference voltage.

15. The test system according to claim 14, wherein the voltage generator is configured to periodically update the first reference voltage, the second reference voltage and the third reference voltage.

16. A semiconductor test system comprising:
a tester circuit configured to supply a first reference voltage, a second reference voltage, and a third reference voltage to at least two transmission/reception circuits, the second reference voltage being greater than the first reference voltage and the third reference voltage being greater than the first reference voltage and less than the second reference voltage; the tester circuit including
a processor configured to execute machine readable instructions to calculate a first propagation delay time and a second propagation delay time of at least two transmission lines connected to corresponding ones of the at least two transmission/reception circuits;
the processor configured to
measure a first time corresponding to a time a first node of the tester circuit is at the first reference voltage,
measure a second time corresponding to a time the first node of the tester circuit is at the second reference voltage,
measure a third time corresponding to a time a second node of the tester circuit is at the first reference voltage, and
measure a fourth time corresponding to a time the second node of the tester circuit is at the third reference voltage;
the tester circuit configured to test at least one device under test on at least one wafer by adjusting first and second output clock signals by an amount corresponding to the first and second propagation delay times.

17. The semiconductor test system of claim 16, wherein the processor is configured to execute machine readable instructions to calculate the first and second propagation delay times by
subtracting the first time from the second time to calculate a first subtracted value,
dividing the first subtracted value by two to calculate the first propagation delay time, and
subtracting the third time from the fourth time to calculate a second subtracted value, and
dividing the second subtracted value by two to calculate the second propagation delay time.

18. The semiconductor test system of claim 16, further comprising:
a probe chamber on one side of the tester circuit and configured to provide room for testing the at least one wafer;
a loader chamber on another side of the probe chamber and configured to transfer the at least one wafer to the probe chamber;
and a probe card coupled to the tester circuit, the probe card configured to test the at least one device under test on the at least one wafer.

19. The semiconductor test system of claim 18, wherein the probe card includes at least one branch line configured to connect to the at least one device under test on the at least one wafer.

20. The semiconductor test system of claim 18, wherein the probe card includes probes configured to physically connect to the at least one wafer.

* * * * *